United States Patent

Leeb

[11] Patent Number: 6,002,585
[45] Date of Patent: Dec. 14, 1999

[54] DEVICE AND METHOD FOR COOLING AND PROTECTING ELECTRONICS

[75] Inventor: Karl-Erik Leeb, Lillebo, Sweden

[73] Assignee: Telefonaktiebolaget LM Ericsson, Stockholm, Sweden

[21] Appl. No.: 09/089,410

[22] Filed: Jun. 3, 1998

[30] Foreign Application Priority Data

Jun. 3, 1997 [SE] Sweden .................................. 9702102

[51] Int. Cl.$^6$ ....................................................... H05K 7/20
[52] U.S. Cl. ........................... 361/690; 361/704; 361/707; 361/713; 361/714; 361/719; 361/720; 361/818; 361/816; 174/16.1; 174/252; 165/80.3; 439/76.1
[58] Field of Search ..................................... 361/690, 697, 361/694, 704, 707, 715, 719–721, 818, 816; 174/16.1, 252; 165/80.3; 439/76.1

[56] References Cited

U.S. PATENT DOCUMENTS

| | | |
|---|---|---|
| 3,934,177 | 1/1976 | Horbach . |
| 4,047,242 | 9/1977 | Jakob et al. . |
| 4,241,380 | 12/1980 | Lehmann et al. . |
| 4,763,225 | 8/1988 | Frenkel et al. ........................... 361/690 |
| 5,400,216 | 3/1995 | Tsai ........................................ 361/684 |
| 5,812,373 | 9/1998 | Hwang .................................... 361/704 |

OTHER PUBLICATIONS

Patent Abstracts of Japan, vol. 13 No. 583, p–981 abstract of JP 1–245188 A (NEC Corp.), Sep. 29, 1989.
Patent Abstracts of Japan, vol. 14, No. 391, E–968 abstract of JP 2–143715 A (NEC ENG Ltd). Jun. 1,1990.
SE, A 9404359–3 (Telefonaktiebolaget LM Ericsson), available 96–06–15, see e.g., p. 4 line 150 p. 5 line 4, corresponds to SE, B, 505, 272 published 97–07–28.

Primary Examiner—Leo P. Picard
Assistant Examiner—Boris L. Chervinsky
Attorney, Agent, or Firm—Burns, Doane, Swecker & Mathis, L.L.P.

[57] ABSTRACT

The present invention relates to a method and a device for protecting electronics which are cooled with exterior air. The device comprises an electronic circuit (8) arranged on an electronic support (1) with associated connector (7), which electronic circuit (8) consists of electronic components and/or subcircuits. The device is characterized in that it comprises on the one hand a first casing (2) which surrounds the electronic circuit (8) and towards and over the surface of which a cooling air current (30) is led, on the other hand a second casing (6) which is arranged to cooperate with the first casing (2) so that a connector (7) associated with the electronic circuit (8) is protected from the cooling air current (30) in a space (13, 16) separated from the cooling air current (30). An object with the present invention is to protect electronic equipment with associated connectors from moisture, gas and contaminants in exterior air and thereby obstruct corrosion damage and leakage currents which occur when exterior air is used for cooling.

16 Claims, 2 Drawing Sheets

DEVICE AND METHOD FOR COOLING AND PROTECTING ELECTRONICS

FIELD OF THE INVENTION

The present invention relates to a method and a device for protecting electronics which are cooled with air, preferably exterior air.

STATE OF THE ART

In electronic components a part of the energy supplied is converted to energy losses in the form of heat. Because the lengths of the lives of the electronic components and their electrical characteristics are temperature dependent good cooling is required in order to maintain the function of the circuits which the components are comprised in. The most commonly existing cooling medium in this connection is air which is available in unlimited amounts.

Cooling systems which use air as cooling medium are relatively voluminous. The size of the cooling system can be reduced and its efficiency improved through a range of different measures such as constructing the heat transferring means with large surfaces and increasing the speed of the cooling air with help of suitable fans.

Electronic equipment which is placed in relatively clean environment with an indoors climate can be cooled with help of the air which is available, that is to say the surrounding air in the room. In such cases there is often a problem in that the temperature of the air in the room successively increases because of the supplied heat. If the cooling air is taken directly from the exterior air without cleaning and possible temper rising and drying problems occur with the contaminants and moisture in the air damaging sensitive components on the circuit board. A known solution to this problem is to transport the heat from the electronics to the external air by heat exchangers or heat pumps and in this way prevent direct contact with the contaminated exterior air.

A problem with such a solution is that the cooling system becomes more complicated and requires more space and furthermore each heat transferring stage tends to increase the temperature difference between the electronics and the exterior air which leads to a reduced cooling efficiency. For electronics which are placed outdoors cooling with exterior air is the most simple but the influence of air contamination and moisture is a problem. Electronic connectors are especially exposed and sensitive.

Multipolar connectors are difficult to design so that they become so air tight that they can withstand long term exposure to exterior air. A problem is namely that corrosion damage occurs on the metal pins and housing of the connector. Another problem is that leakage currents occur between these when moist air condenses. Consequently connectors should not be subjected to exterior air.

To solve the cooling problem through the use of exterior air as cooling air seems to be simple, cheap and effective but leads to that sensitive electronics with associated connectors are exposed to contaminants and condensed air moisture wherefore expensive interruptions in service and expensive maintenance are the consequences.

In certain environments, for example in, and in the vicinity of, industrial buildings gases are present which are extremely aggressive towards the material in electronics and connectors. These gases can come into contact with sensitive electronics or sensitive connectors via the air. There is consequently present a great interest for protecting electronics and connectors against such gases.

The expression exterior air relates in the first instance to air which is not filtered or dried or in some other way treated in order to clean the air of aggressive gases, contaminants or moisture.

DISCLOSURE OF THE INVENTION

The present invention comprises a device and a method for protecting electronic equipment which is cooled with air, preferably exterior air, and the object of the invention is to solve the above mentioned problems which are associated with established techniques.

The present invention tackles the problem of how cooling with exterior air of electronic equipment with associated connectors is to be arranged in order that the equipment is not damaged by moisture, contaminants or gases.

Another problem which the present invention tackles is that simple and cheap connectors are sensitive to air moisture and contaminants. Connectors quickly become expensive and bulky if they are to be constructed in order to handle an aggressive environment for a longer time.

An object with the present invention is consequently to protect electronic equipment with associated connectors from air, gas and contaminants in the exterior air and thereby prevent corrosion damage and leakage currents, which occur when exterior air is used for cooling.

Another object with the present invention for protecting electronic equipment with associated connectors is that it should be cheap, take up only a small space and offer an effective cooling of the electronics.

In short the inventive method means that exterior air is prevented from coming into direct contact with electronics and connectors. The invention consists of two casings which cooperate in order to protect and cool the electronics and protect the connectors.

In more detail the invention for the protection of exterior air cooled electronic equipment comprises on the one hand of a first casing for surrounding the electronic circuit over the surface of which a cooling air stream is led and on the other hand of a second casing which is arranged to cooperate with the first casing so that a connector belonging to the electronic circuit is protected from contact with the cooling air stream in a space separated from the cooling air stream. Between the electronic circuit and the first casing accessories are arranged in order to facilitate heat transfer from the circuit. The electronic equipment comprises electronic circuits with associated connectors arranged on an electronics carrying means. The electronic circuits consists of one or more electronic components and/or subcircuits.

In more detail the following steps are taken in the inventive method for the protection of outer air cooled electronic equipment which comprises one or more connectors on an electronics supporting means on which a electronic circuit comprising of electronic components and/or subcircuits is also arranged:

the arranging of the electronic circuit in a first casing towards which, and over the surface of which, a cooling air stream is guided;

the arranging of a second casing to the first casing so that said connector is protected against the cooling air stream in a separate space.

The advantages with the inventive method and the inventive device are effective cooling with a simple and compact cooling system with short conduction paths for the heat where contaminated and moist air can be lead to the region where the hot circuit parts are without damaging them.

Through separating the connectors in the above mentioned way the connectors are protected and a much simpler electronic connector can be used with a good functional security as a result.

Another advantage is that the device becomes cheaper when complicated designs with cooling flanges, heat exchangers or heat pumps are not used or when the fans and air filters which all require regular inspection and maintenance no longer are necessary for effective cooling and cleaning.

The invention will now be described more closely with the help of preferred embodiments and with reference to the accompanying drawings.

PREFERRED EMBODIMENTS

Figure 1:
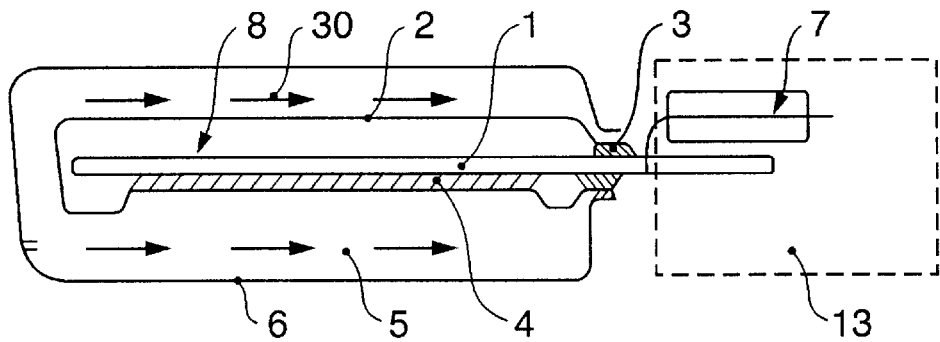
FIG. 1 shows a cross-section of a first embodiment of the invention in which an electronic circuit is surrounded by a first casing and a second casing lying upon it, between which a cooling air stream is guided separated from the connector.

FIG. 1 shows a cross section of a first preferred embodiment of the invention in which a electronic circuit 8 arranged on an electronic supporting means 1 is surrounded by a first casing 2 and a second casing 6 lying on top of it, which form a space 5, where a cooling air stream 30 is led separated from a connector 7 belonging to the electronic circuit 8. The first casing 2 consists of a diffusion-proof material, for example metal or metal plastic laminate. The first casing 2 seals against the electronic supporting means 1 by means of a seal 3. The part of the electronics supporting means 1 where the connector 7 is arranged is in this embodiment outside of the two casings. Consequently the first and second casings, 2 and 6 respectively, only partially cover the electronics supporting means 1. The cooling air 30 therefore will not come into contact with the connector 7 because this is arranged in a separate space 13 which can have a higher temperature than the electronics in general, whereby condensation of moist air is prevented. Another positive effect will be that the air in this region can be held substantially still. The first casing 2 is brought into good thermal contact with the electronic circuit 8 through being in contact with a intermediate layer 4 which has good heat conducting properties and a narrow thickness. The intermediate layer 4 can be self adhesive. Around the first casing 2 flows cooling air 30 which in a suitable way is guided into the other casing 6 through an air intake (not shown in the Figure) and out from this through an outlet (not shown). The inlet and outlet should be so designed so that they permit sufficient quantities of air to pass through the casing 6. They should also be so placed that the cooling air 30 passes past the whole of the first casing 2. In general the inlet and outlet can be adapted according to the construction which the inventive device is fastened in. An example of such a construction is an apparatus cabinet.

The cooling air 30 can in this way be taken from outside and contain high air moisture and high amounts of air contaminants because it is separated from the sensitive parts of the electronic circuit 8 by the diffusion-proof first casing 2 and from the connector 7 because the second casing 6 separates the cooling air 30 from the connector 7. As mentioned earlier, simple and cheap connectors are extremely sensitive to high air moisture and contaminants. Connectors quickly become expensive and bulky if they are to be constructed in order to tolerate an aggressive environment for a long time. Through separating the connectors in the above-stated way the connector is protected and an extremely simple electronic connector can be used with good functional security as a result.

Figure 2:
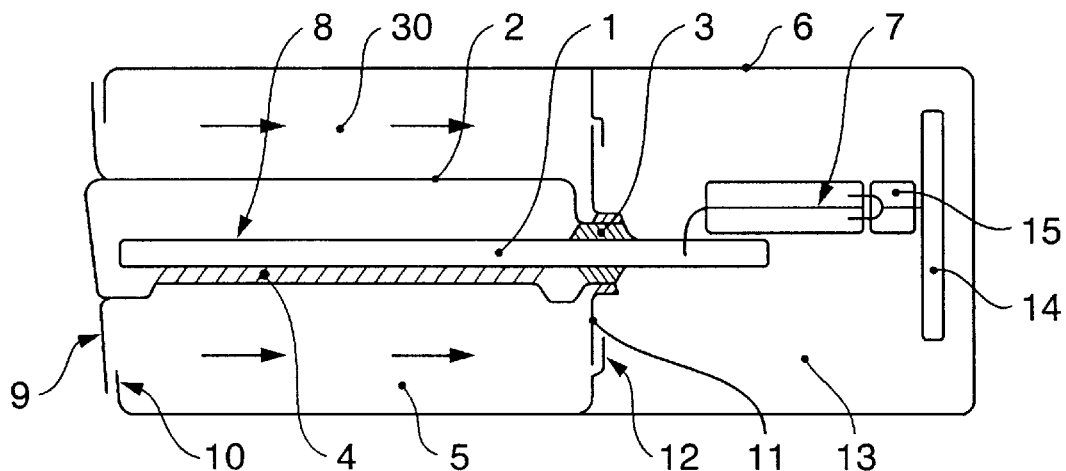
FIG. 2 shows a cross-section of a second embodiment of the invention in which an electronic circuit is surrounded by a first casing and outside of this a part of a apparatus cabinet, which part is designed as a second casing and between which casings a cooling air stream is guided separated from the connector.

FIG. 2 shows a cross section of a second embodiment of the invention where an electronic circuit 8 arranged on an electronics supporting means 1 is surrounded by a first casing 2, all the sides of which except one are covered by a second casing 6. Between these casings 2 and 6 a space 5 is formed in which a cooling air stream 30 is guided separately from the connector 7. The second casing 6 can form a part of a cabinet for electronic equipment. The electronics supporting means 1 with the first casing 2 and the connector 7 forms a plug-in module which can be slid into an opening in the second casing 6 on guide bars (not shown) which are arranged on the inner edge of the second casing. Special slide bars can therefore be placed on the first casing 2. Outside the first casing 2 is a front collar 11 which seals with the seal 3 against the electronics supporting means 1, and a rear collar 9 arranged on the rear edge of the first casing. The collars are so arranged that they seal against the corresponding flanges 10 and 12, which are arranged inside the second casing 6 when the plug-in-module is fully inserted. When the front collar 11 seals against the first flange 12 a protected space 13 for the connector 7 and corresponding connector 15 is formed. This space 13 can also enclose other sensitive electronics 14 which do not require an equally effective cooling as the electronics 8 on the electronics supporting means 1 in the plug-in-module. Because the part of the electronics supporting means 1 where the connector 7 is arranged is in the space 13 then this part can also be used to contain electronics which are not sensitive to high working temperatures. This higher temperature means a more suitable environment for connectors 7 respectively 15 which therefore do not require to be expensive, extremely well sealed and therefore bulky. The opening in the second casing which is formed by the second flange 10 is somewhat bigger than the opening which is formed in the first flange 12 in order that the front collar 11 should be able to freely pass the flange 10. The rear collar 9 of the first casing 2 is larger than the front collar 11 in order that it should be able to effectively seal against the second flange 10. The flange and collars are so adapted that they overlap and either the collar or the flanges can be bent in order that a better sealing can be obtained. More effective sealing can also be obtained with the help of well-fitting gaskets.

Figure 3:
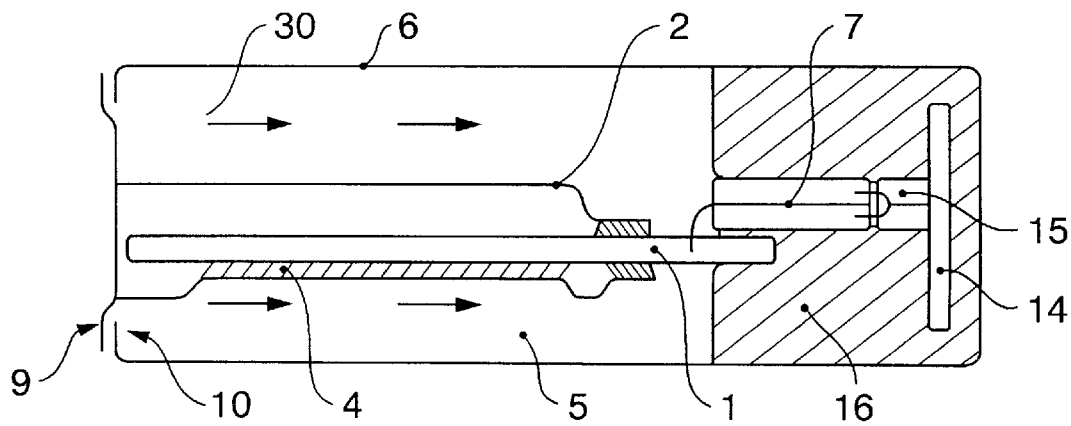
FIG. 3 shows a cross section of a third embodiment of the invention in which an electronic circuit is surrounded by a first casing and a second casing lying outside of it which surrounds a connector and the contact with a porous and elastic filler material.

FIG. 3 shows a cross-section of a third embodiment of the invention in which an electronic circuit 8 arranged on an electronics supporting means 1 is surrounded by a first casing 2 and a second casing 6, lying on the outside of it, which surrounds a connector 7 and a connector 15 with a porous and elastic filler material 16. The material 16 is not completely air-tight but prevents a turnover of cooling air from taking place and contributes through its thermal isolation to an increase of the temperature in the connector 7. A notch in the porous material 16 gives a stable support to the connector 7 and the electronics supporting means 1. This embodiment eliminates the need to arrange a front flange 11 on the first casing 2 and corresponding collar 12 on the second casing 6, as evident from the embodiment according to FIG. 2. The electronics supporting means 1 with the first casing 2 and the connector 7 forms a plug-in-module which can be slid into an opening in the second casing 6 on guide bars (not shown) which are arranged in the inner edge of the second casing. Corresponding slide bars can therefore be provided on the first casing 2. The remaining details of this embodiment correspond to the description of FIG. 2.

Figure 4:
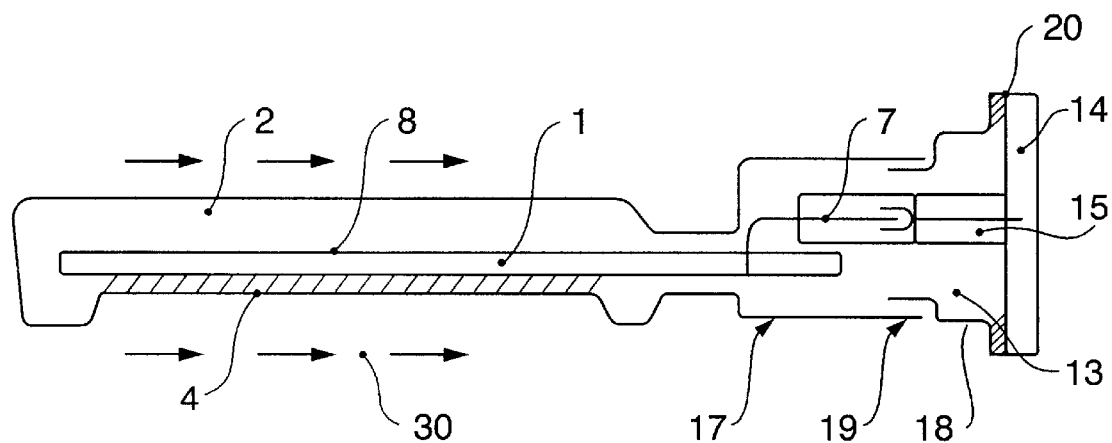
FIG. 4 shows a cross section of a fourth embodiment of the invention in which an electronic circuit with associated connectors is surrounded by a first casing, which casing has an opening and shape adapted to be able to sealingly fit in a second casing which surrounds a connector corresponding to the connector.

FIG. 4 shows a cross-section of a fourth embodiment of the invention in which an electronic circuit 8 arranged on an electronics supporting means 1 is surrounded by a first casing 2 which casing is shaped in order to be able to sealingly fit in a second casing 18 which surrounds a connector 15. In the figure no outer casing is shown. This embodiment, like the earlier embodiments according to FIGS. 2 and 4, can be arranged so that the first casing 2 can with a simple operation be separated from the second casing 18. The second casing 18 can be arranged fixed in a construction of the type cabinet, rack etc. The electronic circuit 8 on the circuit supporting means 1 is, like in previous FIGS. 2 and 3, connected to the electronic circuit 14 via connector 7 and connector 15. The first casing 2 has been increased in length with a connector protection part 17 which is open in the insertion direction. The contact protection part 17 extends so far in the insertion direction that it covers the connectors 7. On a supporting means for the connection circuit 14 is a second casing 18 which is sealed in the joint 20 between the casing 18 and the supporting means for the circuit 14. The connector 15 is arranged in the opening of the casing 18. The edge of the casing 18 is shaped like a flange which together with the edges of the openings of connector protector parts 17 form an overlapping seam 19 which seals when the connector 7 and connector 15 are tightly connected to each other. Through the edge of the contact protector part covering the flange of the casing, cooling air 30 which passes through the whole of the device mainly in the direction of insertion is prevented from coming into the separate space 13 via the seam 19 as the edges of the seam are not directly exposed to the cooling air 30. The sensitive electrical components are consequently effectively protected against contamination and moisture. An optimal working temperature for the circuits 8 and 14 and connector 7 and connector 15 can now be easily obtained with the help of temperature sensing and regulation of the speed of the cooling air.

In the description the expression casing has been used which also includes shell-like constructions of the type such as cages, boxes, tubes, pipes, bottles, etc.

The respective designs of the casings can be simple from a constructional point of view which makes them easy and cheap to manufacture. The first and second casings can each have smooth casings which are manufactured through pressing or casting. The electronic equipment can be easily introduced into and arranged in the first casing whereafter the first casing either can be provided with seals as is evident from FIGS. 1–3 or through the second casing being joined together with the first casing as is shown in FIG. 4.

The invention is naturally not limited to the embodiments described above and shown on the drawings but can be modified within the scope of the accompanying claims.

I claim:

1. Method for the protection of air-cooled electronic equipment, comprising an electronic circuit with a least one associated connector arranged on an electronics support, the electronic circuit includes electronic components and/or subcircuits, the method comprises arranging the electronic circuit in a first casing having an exterior surface, directing a cooling air stream over at least a portion of the exterior surface, placing a second casing adjacent to the first casing so that a space separating a current of cooling air from the connector is created such that cooling air is directed over the exterior surface in the vicinity of the electronic circuit but is essentially prevented from flowing over the at least one connector.

2. Method according to claim 1, further comprising bringing the first casing into good thermal contact with the electronic circuit by introducing an intermediate layer which has good heat conducting properties and short conduction paths in between the first casing and the electronic circuit.

3. Method according to claim 2, wherein the first casing is arranged within the second casing and is configured to lead the cooling air current into contact with the first casing for effective cooling.

4. Method according to claim 3, wherein the first casing is separable from the second casing.

5. Method according to claim 4, further comprising providing a front collar and a rear collar on the first casing, providing a front flange and a rear flange inside the second casing, mating the front flange with the front collar so that a shielded space for the connector is formed inside the second casing, and mating the rear flange with the rear collar so that a space for guiding the cooling air current is formed.

6. Method according to claim 4, further comprising introducing a porous and elastic filler material into the second casing, and providing a groove in the filler material adapted to accommodate the connector and fix the electronics supporting means.

7. Method according to claim 6, further comprising providing a flange on the second casing and a collar on the first casing, and mating the flange with the collar so that a space for guiding the cooling air current is formed.

8. Method according to claim 2, further comprising providing a second casing with a configuration such that it at least partially surrounds the connector, mating the first casing with the second casing so that an overlapping joint is formed thereby defining a common diffusion tight casing for the electronic circuit and the connector which protects against the cooling air current.

9. Device for the protection of air-cooled electronic equipment, comprising an electronic circuit arranged on an electronics support with at least one associated connector, the electronic circuit includes electronic components and/or subcircuits, the device comprises: a first casing which at least partially surrounds the electronic circuit and having an exterior surface over which a cooling air stream is led, and a second casing which is configured to cooperate with the first casing to define a space that contains the cooling air stream, whereby the at least one connector is essentially shielded from the cooling air stream in the space.

10. Device according to claim 9, further comprising an intermediate layer which has good heat conducting properties and short conduction paths in thermal contact with the first casing and the electronic circuit.

11. Device according to claim 10, wherein the first casing is surrounded by the second casing and is configured to guide the cooling air current into contact with the first casing for effective cooling.

12. Device according to claim 11, wherein the first casing is separable from the second casing.

13. Device according to claim 12, further comprising a front collar and a rear collar arranged on the first casing, and a front flange and a rear flange arranged inside the second casing, whereby the front flange is arranged to seal against the front collar so that a protected space for the connector is formed inside the second casing, and the rear flange is arranged to seal against the rear collar so that a space for guiding the cool air current is formed.

14. Device according to claim 12, wherein the second casing surrounds the connector, and a porous and elastic filler material is arranged inside the second casing, the filler material having a groove configured to permit the introduction of the connector and fixing of the electronics support in the filler material.

15. Device according to claim 14 further comprising a flange formed on the second casing and a collar formed on the first casing, the collar and flange configured to mate such that a space for guiding the cooling air current is formed.

16. Device according to claim 10, wherein the second casing is configured to at least partially surround the connector and is joined together with the first casing thereby forming an overlapping joint, both casings form a common diffusion tight casing for the electronic circuit and connector which protects against the cooling air current.

* * * * *